(12) United States Patent
Gorman (10) Patent No.: US 10,135,143 B2
(45) Date of Patent: Nov. 20, 2018

(54) HIGH-EFFICIENCY BROADBAND ANTENNA

(71) Applicant: Worldwide Antenna Systems LLC, Bedford, MA (US)

(72) Inventor: Kurt Gorman, Quakertown, PA (US)

(73) Assignee: WorldWide Antenna Systems LLC

( * ) Notice: Subject to any disclaimer, the term of this patent is extended or adjusted under 35 U.S.C. 154(b) by 48 days.

(21) Appl. No.: 15/474,307

(22) Filed: Mar. 30, 2017

(65) Prior Publication Data

US 2017/0222322 A1 Aug. 3, 2017

Related U.S. Application Data

(63) Continuation-in-part of application No. 14/217,442, filed on Mar. 17, 2014, now Pat. No. 9,647,326.

(60) Provisional application No. 61/800,184, filed on Mar. 15, 2013.

(51) Int. Cl.
| | |
|---|---|
| *H01Q 9/00* | (2006.01) |
| *H01Q 9/04* | (2006.01) |
| *H01Q 1/48* | (2006.01) |
| *H01Q 1/38* | (2006.01) |

(52) U.S. Cl.
CPC ............. *H01Q 9/0442* (2013.01); *H01Q 1/38* (2013.01); *H01Q 1/48* (2013.01)

(58) Field of Classification Search
CPC .................................. H01Q 1/36; H01Q 1/50
See application file for complete search history.

(56) References Cited

U.S. PATENT DOCUMENTS

| | | | | | |
|---|---|---|---|---|---|
| 4,335,469 | A | * | 6/1982 | Tharp | H03H 7/38 343/703 |
| 5,155,495 | A | * | 10/1992 | Hately | H01Q 9/28 343/725 |
| 2003/0085847 | A1 | * | 5/2003 | Waltho | H01Q 21/29 343/850 |
| 2003/0107524 | A1 | * | 6/2003 | Hart | H01Q 21/24 343/860 |
| 2004/0008153 | A1 | * | 1/2004 | Lamensdorf | H01Q 1/362 343/895 |
| 2005/0128154 | A1 | * | 6/2005 | Hately | H01Q 7/00 343/725 |

* cited by examiner

*Primary Examiner* — Graham Smith
*Assistant Examiner* — Jae Kim
(74) *Attorney, Agent, or Firm* — Hunter Clark PLLC (57) ABSTRACT

Techniques for tuning a crossed-field antenna are provided. An example of an antenna system includes a D-plate with a D-plate feed conductor, such that the D-plate is a horizontal conductor raised above and insulated from a ground plane, an E-cylinder with an E-cylinder feed conductor, such that the E-cylinder is a vertical hollow conductive cylinder of smaller diameter than the D-plate, which is mounted concentrically above and insulated from the D-plate, a transmitter tuning circuit configured to receive a signal from a transmitter, an E-cylinder tuning circuit operably coupled to the transmitter tuning circuit and the E-cylinder feed conductor, and a D-plate tuning circuit operably coupled to the transmitter tuning circuit and the D-plate feed conductor.

20 Claims, 8 Drawing Sheets

HIGH-EFFICIENCY BROADBAND ANTENNA

CROSS-REFERENCE TO RELATED APPLICATIONS

This application is a continuation-in-part of U.S. patent application Ser. No. 14/217,442 filed on Mar. 17, 2014, entitled "High-Efficiency Broadband Antenna," which claims the benefit of U.S. Provisional Application No. 61/800,184, filed Mar. 15, 2013, entitled "High-Efficiency Broadband Antenna," the entire contents of which is hereby incorporated herein by reference.

TECHNICAL FIELD

This application relates to crossed-field radio-frequency antennas.

BACKGROUND

A crossed-field antenna ("CFA") is a type of antenna designed for long and medium wave broadcasting. Conventional CFAs were first developed by Hately & Kabbary (see U.S. Pat. No. 5,155,495, issued 13 Oct. 1992; U.S. Pat. No. 6,025,813, issued 15 Feb. 2000; and U.S. Pat. No. 7,113,138, issued 26 Sep. 2006). These authors describe an antenna with two parts, one of which produces a high frequency electric field, and the other of which produces a high frequency magnetic field. The electric and magnetic field lines are arranged to cross, and thereby synthesize and propagate radio waves. CFAs based on the Hately and Kabbary design typically consist of two driven elements and a ground plane in various configurations, tuned by means of one antenna tuning unit ("ATU") or feed circuit.

Such CFAs were touted as a highly efficient antenna design that uses far less height than conventional antennas. Although there was initial excitement about such antennas in the 1980s and early 1990s, the efficiency of prior art designs, based on real-world testing, did not live up to the initial expectations. Because these initial CFA designs were not as efficient as initially expected, there is a need for a design that retains the size advantages of a conventional CFA, but is capable of high efficiency for its size.

SUMMARY

Described herein are embodiments including a high-efficiency broadband antenna comprising: a D-plate comprising a horizontal conductor raised above and insulated from a ground plane, and a D-plate feed conductor; an E-cylinder comprising a vertical hollow conductive cylinder of smaller diameter than the D-plate, which is mounted concentrically above and insulated from the D-plate, and an E-cylinder feed conductor; a transmitter input feed, connected to a source of modulated alternating current; a first antenna feed network, with adjustable impedance, configured to feed approximately half of the power from the transmitter input feed to the E-cylinder; and a second antenna feed network, with adjustable impedance, configured to feed approximately half of the power from the transmitter input feed to the D-plate.

An example of an antenna system according to the disclosure includes a D-plate including a D-plate feed conductor, such that the D-plate is a horizontal conductor raised above and insulated from a ground plane, an E-cylinder including an E-cylinder feed conductor, such that the E-cylinder is a vertical hollow conductive cylinder of smaller diameter than the D-plate, which is mounted concentrically above and insulated from the D-plate, a transmitter tuning circuit configured to receive a signal from a transmitter, an E-cylinder tuning circuit operably coupled to the transmitter tuning circuit and the E-cylinder feed conductor, and a D-plate tuning circuit operably coupled to the transmitter tuning circuit and the D-plate feed conductor, such that an E-cylinder tuning circuit reactance and a D-plate tuning circuit reactance are set such that approximately equal power is provided to the E-cylinder and the D-plate, and a transmitter tuning circuit reactance is set based at least in part on the E-cylinder tuning circuit reactance and the D-plate tuning circuit reactance.

Implementations of such an antenna system may include one or more of the following features. The E-cylinder tuning circuit reactance and the D-plate tuning circuit reactance may be set such that a phase difference between an E-cylinder feed signal detected on the E-cylinder feed conductor and a D-plate feed signal detected on the D-plate feed conductor is approximately 90 degrees. The transmitter tuning circuit may include a T-network with a first inductor, a second inductor, and a shunt leg including a variable capacitor and a parallel capacitor. An inductance value for each of the first inductor and the second inductor may be between 1 and 100 microhenries. The E-cylinder tuning circuit may include a series inductor and a variable shunt inductor. An inductance value for each of the series inductor and the variable shunt inductor may be between 1 and 100 microhenries. The D-plate tuning circuit 614 may include a series variable inductor with a shunt inductor. An inductance value for each of the series variable inductor and the shunt inductor may be between 1 and 100 microhenries.

An example method of tuning a crossed-field antenna including an E-cylinder and D-plate, such that the E-cylinder and the D-plate are operably coupled to a tuning network including a transmitter feed tuning circuit, an E-cylinder tuning circuit, and a D-plate tuning circuit, the method according to the disclosure includes determining a current ratio to provide approximately equal power to the E-cylinder and the D-plate, setting a reactance of the E-cylinder tuning circuit and a reactance of the D-plate tuning circuit based on the current ratio, determining a combined impedance value based at least in part on the reactance of the E-cylinder tuning circuit and the reactance of the D-plate tuning circuit, and setting a reactance of the transmitter feed tuning circuit based on the combined impedance value.

Implementations of such a method may include one or more of the following features. A phase difference of signals provided to the E-cylinder and the D-plate may be determined. Setting the reactance of the E-cylinder tuning circuit and the reactance of the D-plate tuning circuit may be based at least in part on the phase difference. Impedance values of each of the E-cylinder and the D-plate may be estimated, and determining the current ratio may be based at least in part on the estimated impedance values. The estimated impedance values may be based at least in part on measurements obtained from a vector network analyzer.

An example of a tuning system for coupling a transmitter with a crossed-field antenna, the crossed-field antenna including an E-cylinder and a D-plate, the tuning system according to the disclosure including an E-cylinder tuning circuit operably coupled to the E-cylinder, a D-plate tuning circuit operably coupled to the D-plate, a transmitter feed tuning circuit operably coupled to the transmitter, the E-cylinder tuning circuit, and the D-plate tuning circuit, and a controller operably coupled to the transmitter feed tuning circuit, the E-cylinder tuning circuit, and the D-plate tuning circuit, the controller including at least one processor configured to set an E-cylinder tuning circuit reactance and a D-plate tuning circuit reactance such that approximately equal power is provided to the E-cylinder and the D-plate, and set a transmitter feed tuning circuit reactance based at least in part on the E-cylinder tuning circuit reactance and the D-plate tuning circuit reactance.

Implementations of such a tuning system may include one or more of the following features. The at least one processor may be further configured to set the E-cylinder tuning circuit reactance and the D-plate tuning circuit reactance such that a phase difference between an E-cylinder feed signal and a D-plate feed signal is approximately 90 degrees. The transmitter feed tuning circuit may include a T-network with a first inductor, a second inductor, and a shunt leg including a variable capacitor and a parallel capacitor. The E-cylinder tuning circuit may include a series inductor and a variable shunt inductor. The D-plate tuning circuit 614 may include a series variable inductor with a shunt inductor. The controller may be operably coupled to the transmitter. One or more signal sensors may be operably coupled to the controller, such that the one or more signal sensors are configured to detect signal emitted from the crossed-field antenna.

Items and/or techniques described herein may provide one or more of the following capabilities, as well as other capabilities not mentioned. A transmitter may provide a signal to a crossed-field antenna system via a tuning network. The crossed-field antenna may include an E-cylinder element and a D-plate element. The tuning network may include a transmitter feed tuning circuit, an E-cylinder tuning circuit and a D-plate tuning circuit. The tuning network may include a plurality of variable reactive elements such as variable capacitors and variable inductors. In an example, the tuning network may include a controller configured to change the impedance of the variable reactive elements. The impedance of the E-cylinder tuning circuit and the D-plate tuning circuit may be set such that each element receives approximately equal power. The impedance of the transmitter feed tuning circuit may be set based at least in part on the combined impedance of the E-cylinder tuning circuit and the D-plate tuning circuit. The controller may receive signal sensor information and vary one or more impedance values in the tuning network based on the sensor information. Other capabilities may be provided and not every implementation according to the disclosure must provide any, let alone all, of the capabilities discussed. Further, it may be possible for an effect noted above to be achieved by means other than that noted, and a noted item/technique may not necessarily yield the noted effect.

DETAILED DESCRIPTION

The present disclosure describes high-efficiency broadband antennas and associated circuitry systems that overcome the efficiency limitations of prior art CFAs.

Various example embodiments of the present inventions are described herein. Those of ordinary skill in the art will realize that the following detailed description is illustrative only and is not intended to be in any way limiting. Other embodiments will readily suggest themselves to such skilled persons having the benefit of this disclosure.

In the interest of clarity, not all of the routine features of the implementations described herein are shown and described. In the development of any such actual implementation, numerous implementation-specific decisions must be made in order to achieve the developer's specific goals, such as compliance with application, safety, regulatory, and business constraints, and that these specific goals will vary from one implementation to another and from one developer to another. Moreover, it will be appreciated that such a development effort might be complex and time-consuming, but would nevertheless be a routine undeliaking of engineering for those of ordinary skill in the art having the benefit of this disclosure.

Figure 1:
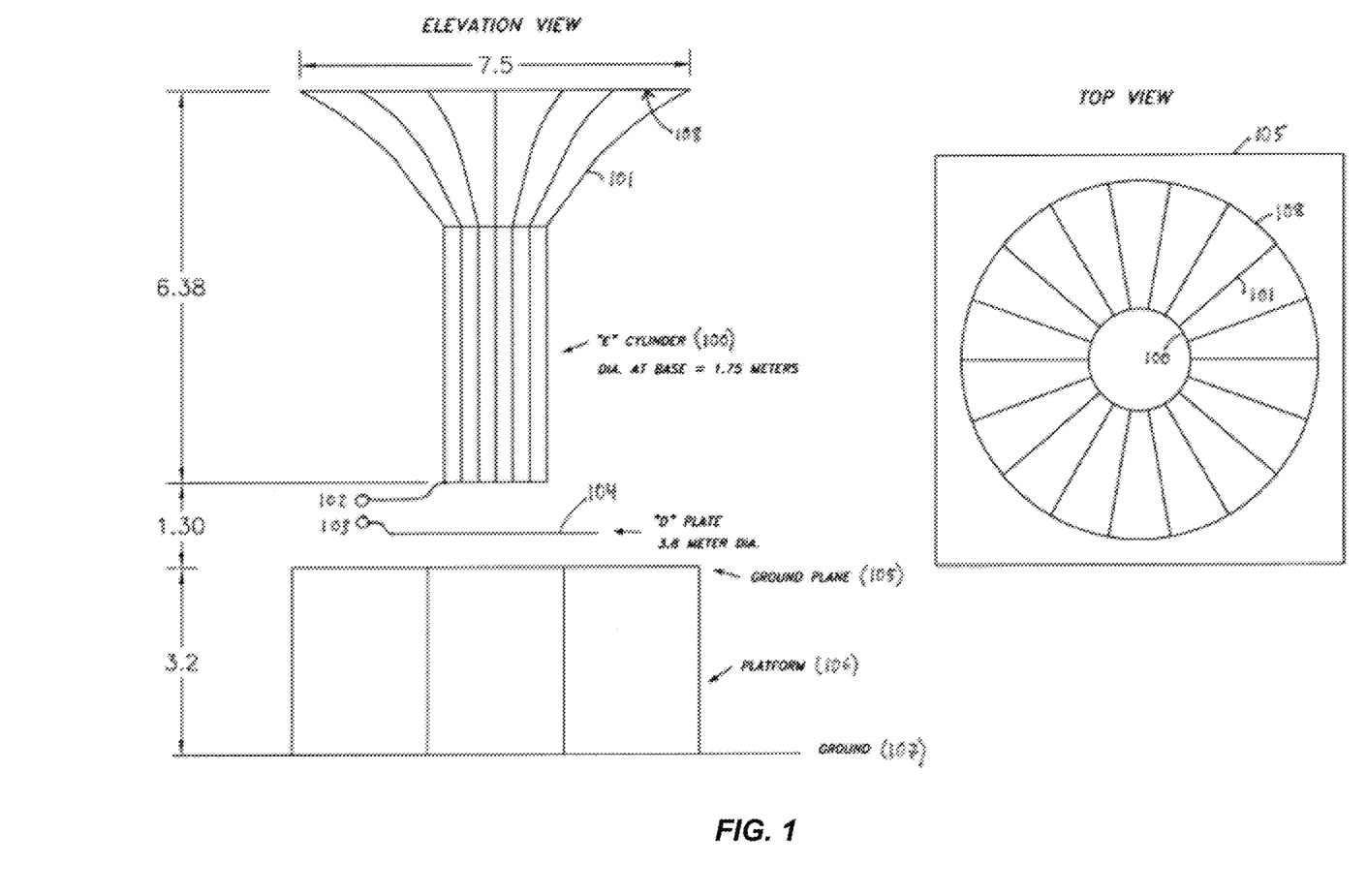
FIG. 1 is a drawing illustrating an example antenna, including an elevation view and top view.

FIG. 1 shows one embodiment of high-efficiency broadband antenna. In this embodiment, the antenna system includes cylindrical structure called an E-cylinder 100. In one embodiment, the E-cylinder may be a hollow metal cylinder. It may be formed of a sheet of metal or concentric sheets of metal, either solid or perforated by openings, or in one embodiment it may be formed of a lattice of metal wires, tubes, or bars. These wires, tubes or bars may, in one embodiment, be arranged in a cage-like structure with vertical bars. These bars may be joined at the top and/or bottom by rings. Each E-cylinder may be connected by a conductive feed 102 such as a coaxial cable.

In one embodiment, the E-cylinder extends into to a funnel structure 101 connected to the cylindrical part of the E-cylinder at its top end. In one embodiment, this funnel structure may have a roughly cone shape or a tapering cone or funnel shape. This structure may radiate out from the cylindrical part of the E-cylinder and terminate in a rim 108 that is larger than the diameter of the E-cylinder.

A D-plate 104 may be positioned below the base of the E-cylinder. It may be insulated from the E-cylinder, as well as insulated from a ground plane 105 below it. The D-plate may in one sheet of metal or concentric sheets of metal, either solid or perforated by openings, or in one embodiment it may be formed of a lattice of metal wires, tubes, or bars. It may be connected, via a conductor, to conductive feed 103 such as a coaxial cable.

Below the D-plate may be a ground plane 105 and a platform 106 to raise the antenna above ground level 107. The dimensions of the ground plan may vary based on the an intended range of operation. For example, the ground plane 105 may be, in one embodiment, at least 25'×25' for a transmission frequency of 1.630 MHz. In another example, the ground plane may be at least 30'×30' for a transmission frequency of 940 kHz. The dimensions of the ground planes are examples only, and not limitations as other sizes of ground planes may also be used with these and other frequency ranges.

In an example, the D-plate may be a horizontal conductor raised above and insulated from a ground plane, and the E-cylinder may be a vertical hollow conductive cylinder of smaller diameter than the D-plate, which is mounted concentrically above and insulated from the D-plate. In one embodiment, the antenna can be placed on a building or tower to increase its height and avoid ground-level effects and interference.

The height of the E-cylinder, the diameter of the D-plate and the area of the ground plane may be designed to have a specific relationship to the broadcast frequency. In the case of 1.630 MHz, one embodiment of the antenna may have an E-cylinder (including the funnel structure) of approximately 6.38 meters, while the diameter of the D-plate may be approximately 3.8 meters. In the embodiment shown in FIG. 1, the diameter of the E-cylinder is 1.75 meters, the diameter of the lip of the funnel structure is 7.5 meters, the height of the platform is 3.2 meters, and the gap between the ground plane and the base of the E-cylinder is 1.3 meters. This configuration may in one embodiment be scaled larger or smaller by a scale factor.

The antenna may be fed via feeds (102 and 103) from a feed circuit or set of feed circuits. Specific multiple networks may be designed that feed approximately half of the transmitter input power to the E-cylinder 100, and approximately half to the D-plate 104. These networks may provide impedance isolation at the input, while allowing adjustment of the antenna element phasing to be such that the electric and magnetic fields generated by the antenna elements produce surface wave propagation.

Figure 2:
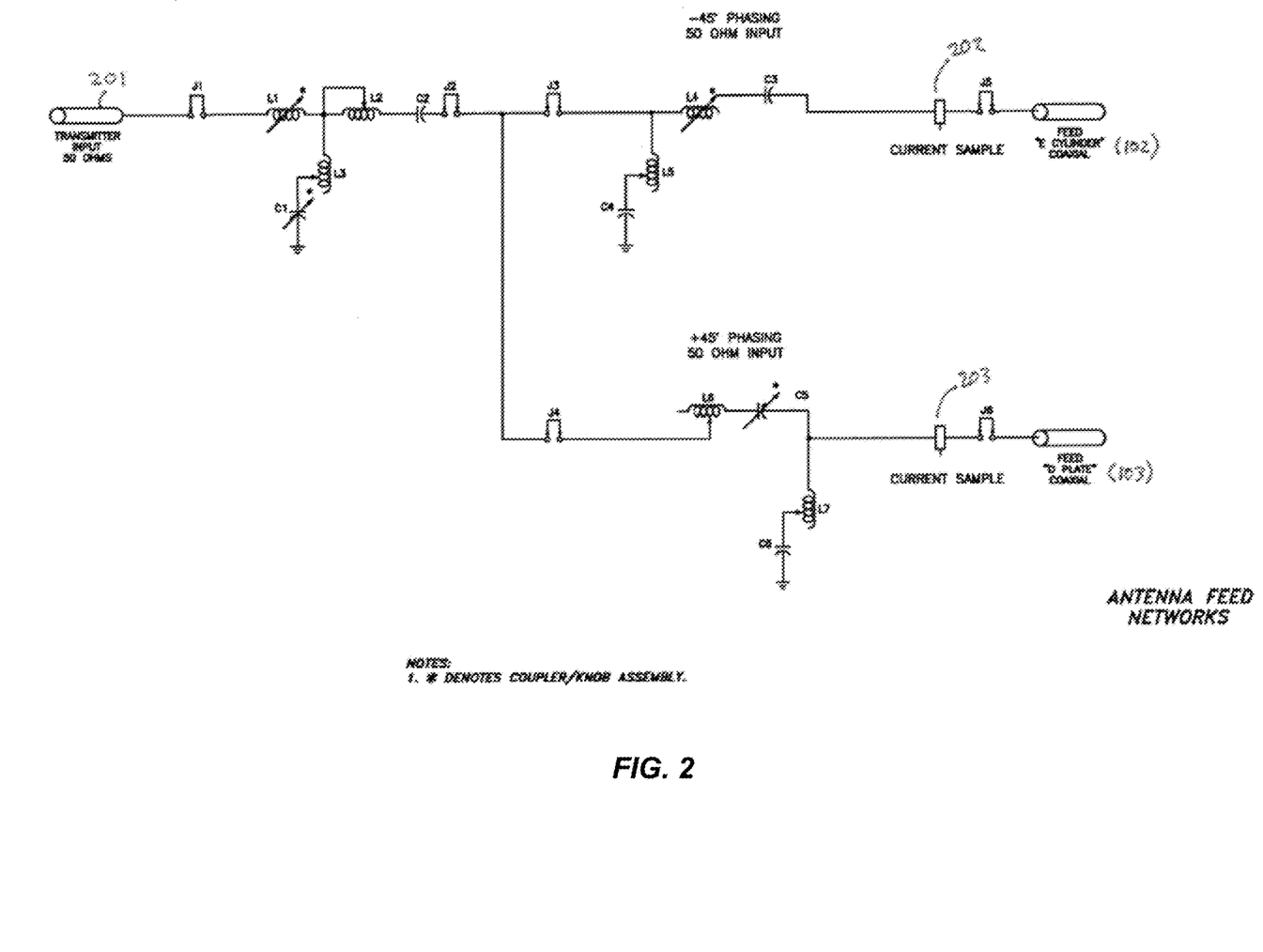
FIG. 2 is a schematic drawing illustrating an embodiment of antenna feed networks.

FIG. 2 shows one embodiment of specific antenna feed networks for an E-cylinder and a D-plate. A transmitter input 201 may provide a source of modulated alternating current to be transmitted over the antenna. This transmitter power may in one embodiment be fed to two antenna feed networks. These networks may be distinct, and each have adjustable impedance. In one embodiment, approximately half of the power from the transmitter input 201 may be sent to the E-cylinder via the first network, and approximately half may be sent to the D-plate via the second network. Approximately half may be within +/−10% (e.g., 40%-60%). In one embodiment, the first network may be phased −45 degrees, and the second network may be phased +45 degrees. In one embodiment, these phases may be adjustable.

With the use of multiple networks in this embodiment, the antenna system may be able to be adjusted for maximum radiation efficiency. In addition, the input impedance within approximately 20 kHz of the operating carrier frequency may be sufficiently consistent that digital broadcasting signals may be transmitted with the antenna.

In one embodiment, an antenna as described herein may be tuned. Current and voltage samplers 202, 203 may be utilized to measure the magnitude and phase of both the current and voltage at the feed point of both antenna elements simultaneously. This allows the adjuster to set the feed point parameters for based on radiation output. Once the feed point parameters are set, the network system that feeds both elements of the antenna may be adjusted to provide a resistive input impedance as compared to the reactive impedance of the elements. These resistances may be paralleled at the input circuit and then matched to the transmitter input resistance.

Figure 3:
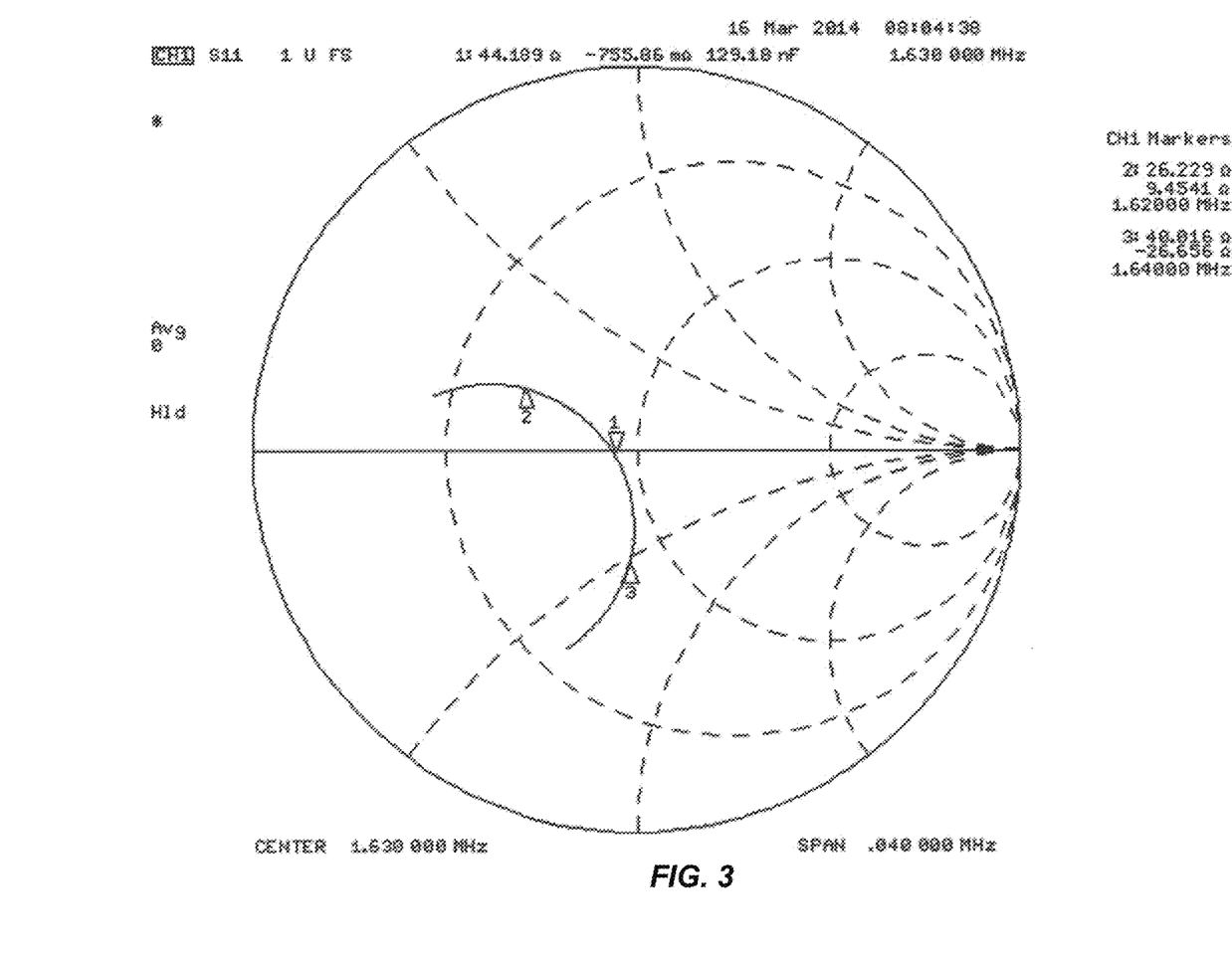
FIG. 3 is a Smith chart illustrating measured input impedance for an example antenna embodied in this disclosure.
Figure 4:
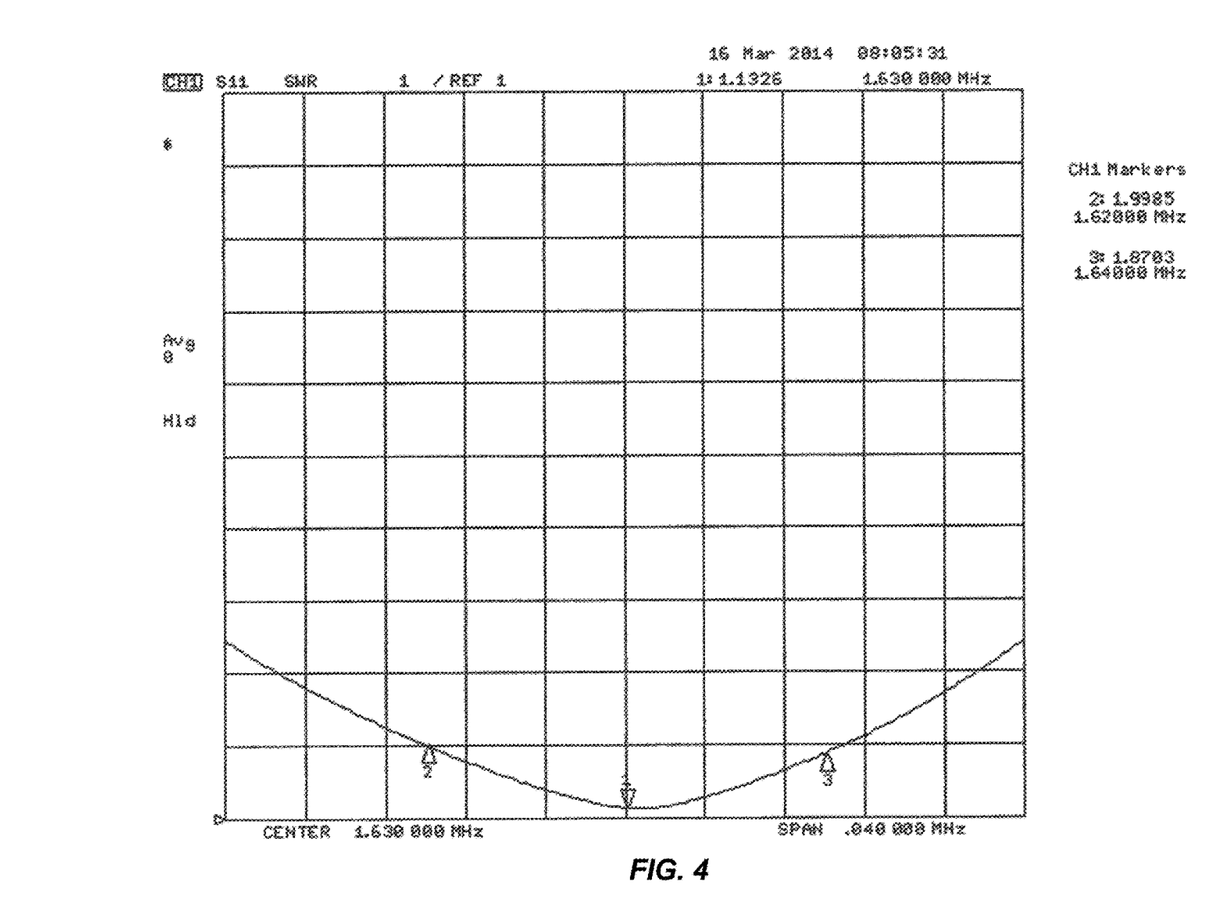
FIG. 4 is a plot of voltage standing wave ratio (VSWR) versus frequency for an example antenna embodied in this disclosure.

FIG. 3 is a Smith chart illustrating the measured input impedance for an example antenna as described in this disclosure, corresponding to the dimensions set forth in FIG. 1. The measurements describe a feed frequency of 1.630 MHz, as well as at 1.620 MHz and 1.740 MHz. FIG. 4 is a plot of voltage standing wave ratio (VSWR) versus frequency corresponding to the same measurements as FIG. 3. These plots show antenna input parameters without any additional optimization. The plots demonstrate improved input bandwidth (impedance/VSWR) as compared to a conventional short monopole.

Figure 5:
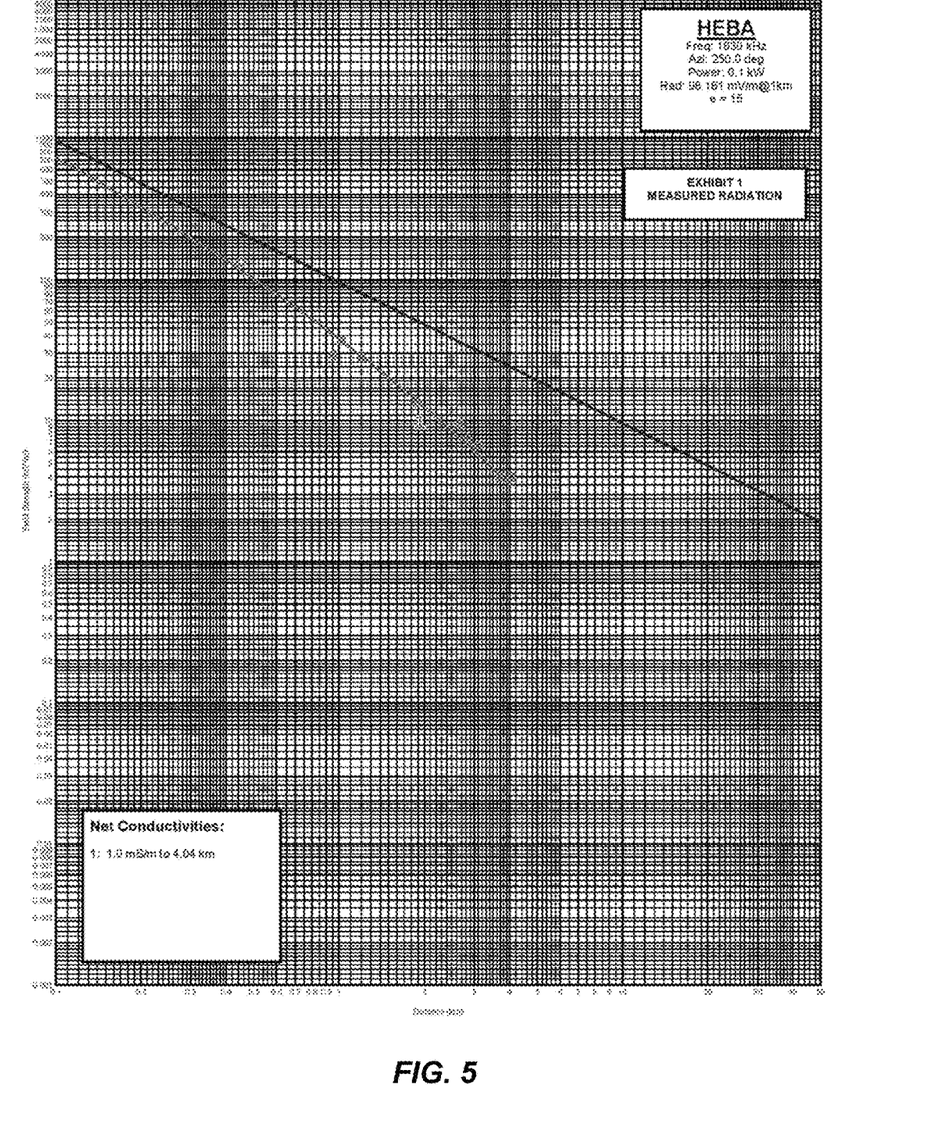
FIG. 5 is a plot of field strength versus distance for an example antenna embodied in this disclosure.

FIG. 5 is a chart showing field intensity for an example antenna as described in this disclosure, corresponding to the dimensions set forth in FIG. 1. Measurements were made with a Potomac Instruments FIM-41 field intensity meter. The measurements were performed on a bearing of 250° from the antenna, and within a distance of about 3-4 km from the antenna to minimize attenuation due to ground conductivity.

The data reflected in the plot are set forth in Table 1. The analyzed data yields an unattenuated field of 96.161 mV/m with an input power of 100 watts at 1.630 MHz. This equates to 304.1 mF/m for a nominal 1.0 kW input power.

TABLE 1

Field Strength Measurements

| Point number | Distance (km) | Field Strength (mV/m) |
| --- | --- | --- |
| 1 | 0.06 | 960 |
| 2 | 0.45 | 133 |
| 3 | 0.96 | 29.1 |
| 4 | 1.02 | 37.0 |
| 5 | 1.20 | 28.0 |
| 6 | 1.88 | 13.5 |
| 7 | 2.68 | 7.40 |
| 8 | 2.85 | 9.40 |
| 9 | 3.09 | 6.65 |
| 10 | 3.68 | 4.00 |
| 11 | 4.04 | 3.97 |

Figure 6:
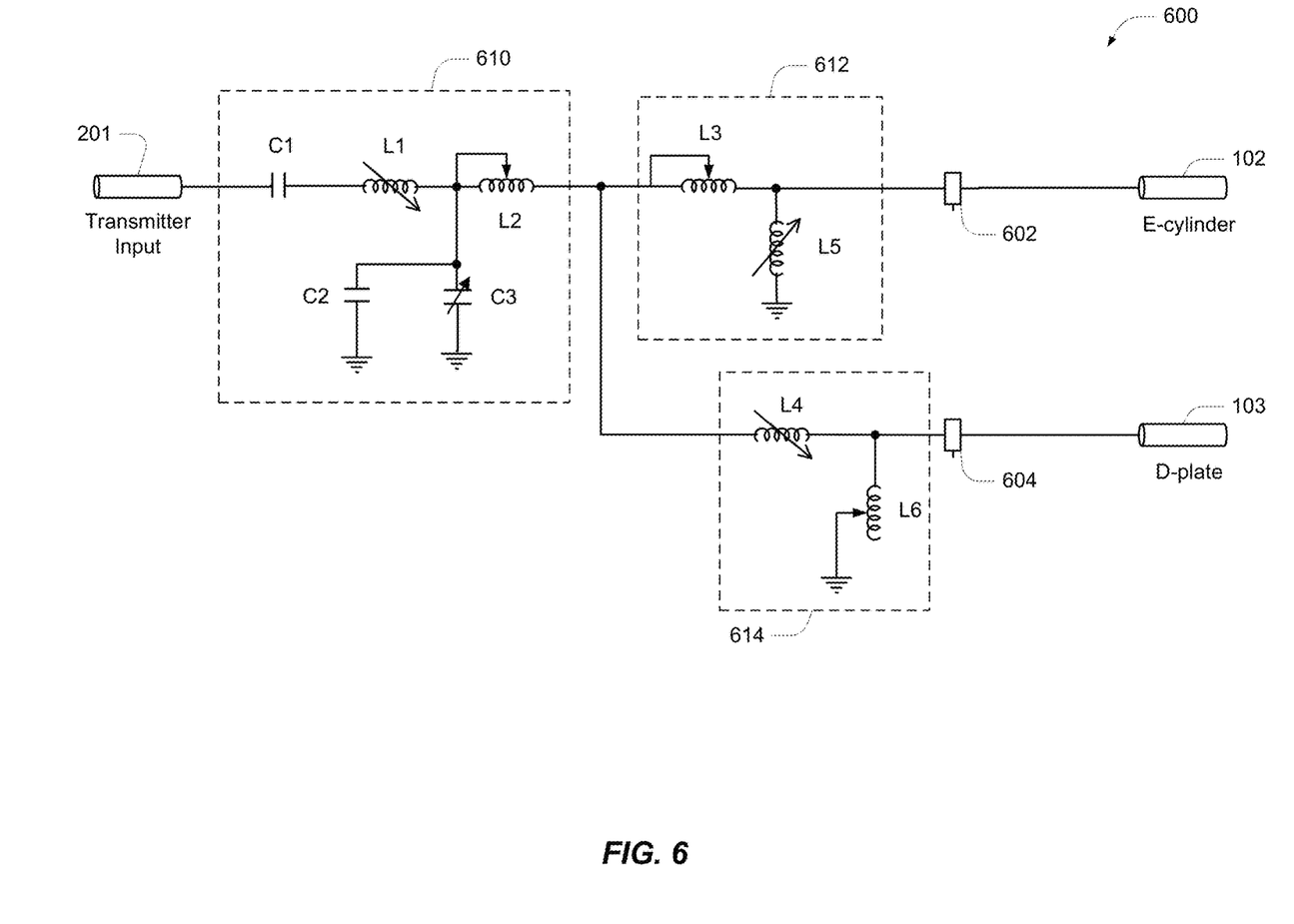
FIG. 6 is a schematic drawing illustrating another embodiment of an antenna feed network.

Referring to FIG. 6, a schematic drawing illustrating another embodiment of an antenna feed network 600 is shown. The network 600 receives a signal from a transmitter via a transmitter input 201 and provides outputs to the E-cylinder and the D-plate via the E-cylinder feedline 102 and the D-plate feedline 103. An E-cylinder feedline sampling toroid 602 and a D-plate feedline sampling toroid 604 are configured to detect the output signal of the respective feedlines and may be used for tuning and monitoring of the network output. For example, E-cylinder feedline sampling toroid 602 can measure an E-cylinder feed signal and the D-plate feedline sampling toroid 604 can measure a D-plate feed signal. The network 600 includes a transmitter tuning circuit 610, an E-cylinder tuning circuit 612, and a D-plate tuning circuit 614. The specifications of the components in the network may vary based on the frequency and power of the signal received on the transmitter input 201. For medium frequency (MF) applications, the transmitter tuning circuit 610 may include a series capacitor C1 in a range of 100 picofarads to 0.1 microfarads may be used. The transmitter tuning circuit also includes a T-network with a first inductor L1, a second inductor L2, and a shunt leg including a variable capacitor C3 and a parallel capacitor C2. As examples, and not limitations, the inductors L1, L2 may be valued between 1 to 100 microhenries, and the capacitors C2, C2 may be valued between 100 picofarads to 0.1 microfarads. The E-cylinder tuning circuit 612 includes a series inductor L3 and a variable shunt inductor L5. The inductor values in the E-cylinder tuning circuit 612 are typically within a range from 1 to 100 microhenries. The D-plate tuning circuit 614 includes a series variable inductor L4 with a shunt inductor L6. The inductor values in the D-plate tuning circuit 614 are typically within a range from 1 to 100 microhenries. Other values for the inductors and capacitors in the network 600 may be used based on operating frequency and other variations in the antenna construction, grounding topology, and/or geographic properties at the antenna site.

Figure 7:
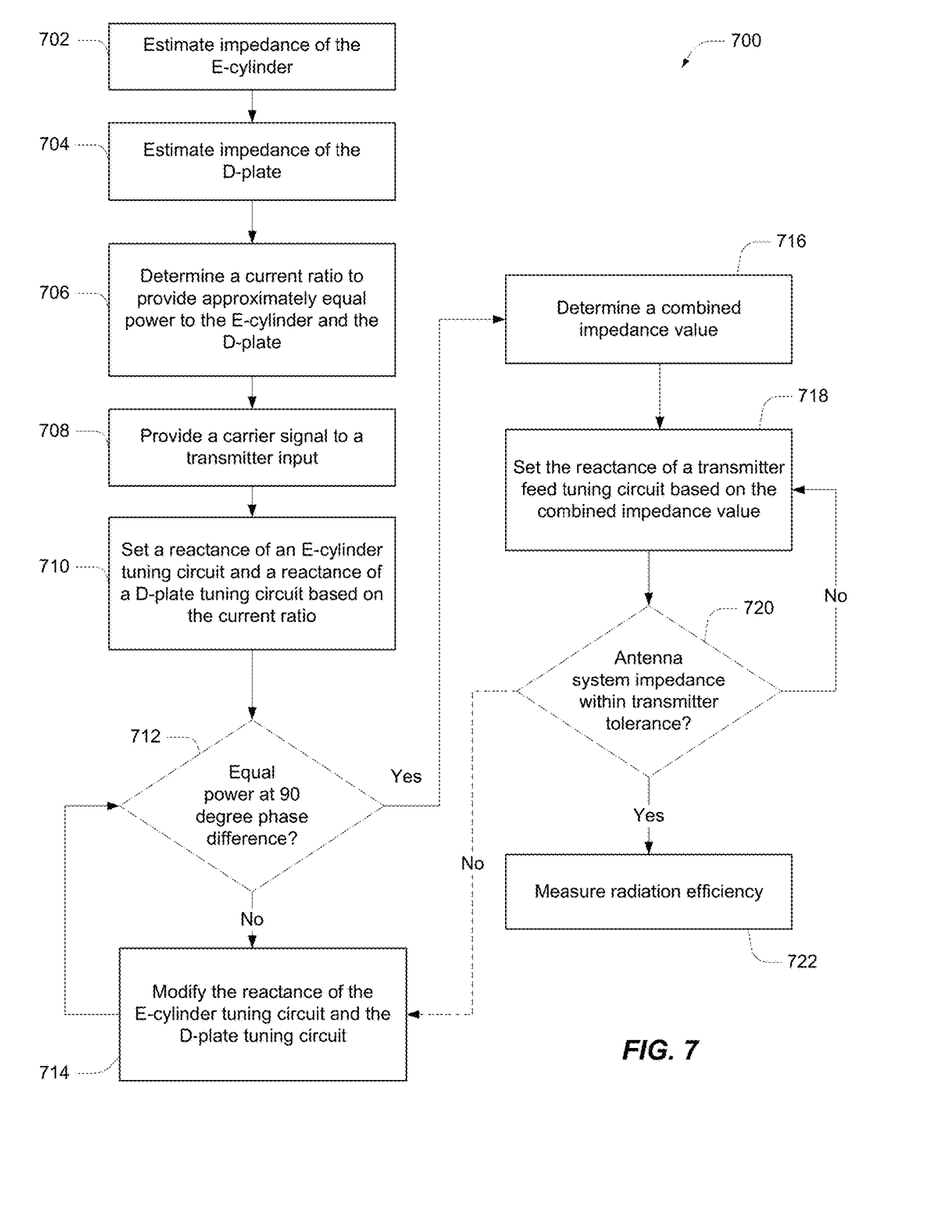
FIG. 7 is a process flow diagram for tuning an antenna feed network.

Referring to FIG. 7, with further reference to FIGS. 1-6, a method 700 of tuning an antenna feed network includes the stages shown. The method 700 is, however, an example only and not limiting. The method 700 may be altered, e.g., by having stages added, removed, rearranged, combined, performed concurrently, and/or having single stages split into multiple stages.

At stage 702, the method includes estimating the impedance of the E-cylinder. The impedance estimate may be based on computer modeling (e.g., finite element analysis) or through data collection. For example, a Vector Network Analyzer (VNA) may be used to measure the impedance as a function of frequency. A VNA may be coupled to the E-cylinder feedline 102 to obtain an impedance estimate for a desired operation frequency. At stage 704, the process may be repeated to estimate the impedance of the D-plate. For example, a VNA may be coupled to the D-plate feedline 103 to determine the impedance of the D-plate at the desired operating frequency.

At stage 706, the method includes determining a current ratio to provide approximately equal power to the E-cylinder and the D-plate. The current ratio is based on the impedance values determined at stages 702 and 704 and the power values for the E-cylinder and D-plate may be +/−10% of one another (e.g., approximately equal). The current into the feed lines may be measured via the sampling toroids 602, 604 and the current ratio is used during the tuning process to ensure approximately equal power is delivered to the E-cylinder and the D-plate.

At stage 708, the method includes providing a carrier signal to a transmitter input. The carrier signal may be the desired operation frequency (e.g., 940 kHz, 1250 kHz, 1630 kHz etc.) and it may be provided via the transmitter input 201. The power of the carrier may be low for the initial tuning (e.g., 1-5 Watts), and it may be increased as the network 600 is tuned. The signal to the E-cylinder and the D-plate may be monitored with the respective sampling toroids 602, 604.

At stage 710, the method includes setting the reactance of an E-cylinder tuning circuit and a D-plate tuning circuit based on the current ratio. For example, referring to FIG. 6, the variable inductor L5 in the E-cylinder tuning circuit 612 and the variable inductor L4 in the D-plate tuning circuit 614 may be set to initial values such that the total impedance of each circuit leg (e.g., including the respective antenna elements) are approximately equal. The current flowing in each circuit leg may be measured with the respective sampling toroids 602, 604. At stage 712, the method includes determining if the signals measured the E-cylinder feedline 102 and the D-plate feedline 103 are at equal power and at a 90 degree phase difference. For example, the magnitude and phase of the current and voltage on the feed signals may be simultaneously monitored at the sampling toroids 602, 604. At stage 714, the method includes modifying the reactance of the E-cylinder tuning circuit and/or the D-plate tuning circuit if the power to each element is not approximately equal, or the phase differences is not approximately 90 degrees (e.g., +/−5 degrees).

In general, the modifications to the variable inductors L5, L4 are made individually (e.g., one at a time) and the results are monitored at the sampling toroids 602, 604. The impedance of E-cylinder tuning circuit 612 or the D-plate tuning circuit 614 may be adjusted to achieve the desired phase and power requirements.

At stage 716 the method includes determining a combined impedance value. Referring to FIG. 6, the combined impedance value is measured at the junction on the output of the transmitter feed tuning circuit 610 and indicates the combined impedance of the E-cylinder leg (e.g., including the E-cylinder tuning circuit 612) and the D-plate leg (e.g., including the D-plate tuning circuit 614). The combined impedance value is based at least on the reactance values of the E-cylinder tuning circuit and the D-plate tuning circuit.

At stage 718, the method includes setting a reactance of the transmitter feed tuning circuit 610 based on the combined impedance value. The transmitter feed tuning circuit 610 operates as an impedance matching circuit between the transmitter and the E-cylinder and D-plate tuning circuits 612, 614. For example, a transmitter may be configured to operate with a 50 ohm antenna load, and the junction impedance (e.g., the combined impedance value) may be approximately 25 ohms. The impedance values are examples only as different antenna configurations and transmitters may be different electrical properties. For example, at stage 720, the method includes determining if the antenna system impedance is within the transmitter tolerance. A transmitter may be configured to determine a level of reflected power from an antenna system. Class-E amplifiers are particularly sensitive to an impedance mismatch and the resulting power reflected from an antenna system. For example, the transmitter may be configured to monitor VSWR at the transmitter output (e.g., the transmitter input 201 to the network 600). The impedance of the transmitter feed tuning circuit 610 may be adjusted using the variable capacitor C3 and/or the variable inductor L1 to reduce the impedance mismatch. In an example, if tuning the transmitter feed tuning circuit 610 does not reduce the antenna system to an acceptable level, the E-cylinder tuning circuit 612 and/or the D-plate tuning circuit 614 may be adjusted.

At stage 722, the method includes measuring the radiation efficiency. One or more field intensity meters, or other measurement devices, may be used to measure the field strength of the signal as discussed in regards to FIG. 5. The measuring toroids 602, 604 may also be used to measure the power out based on the transmitter input power.

Figure 8:
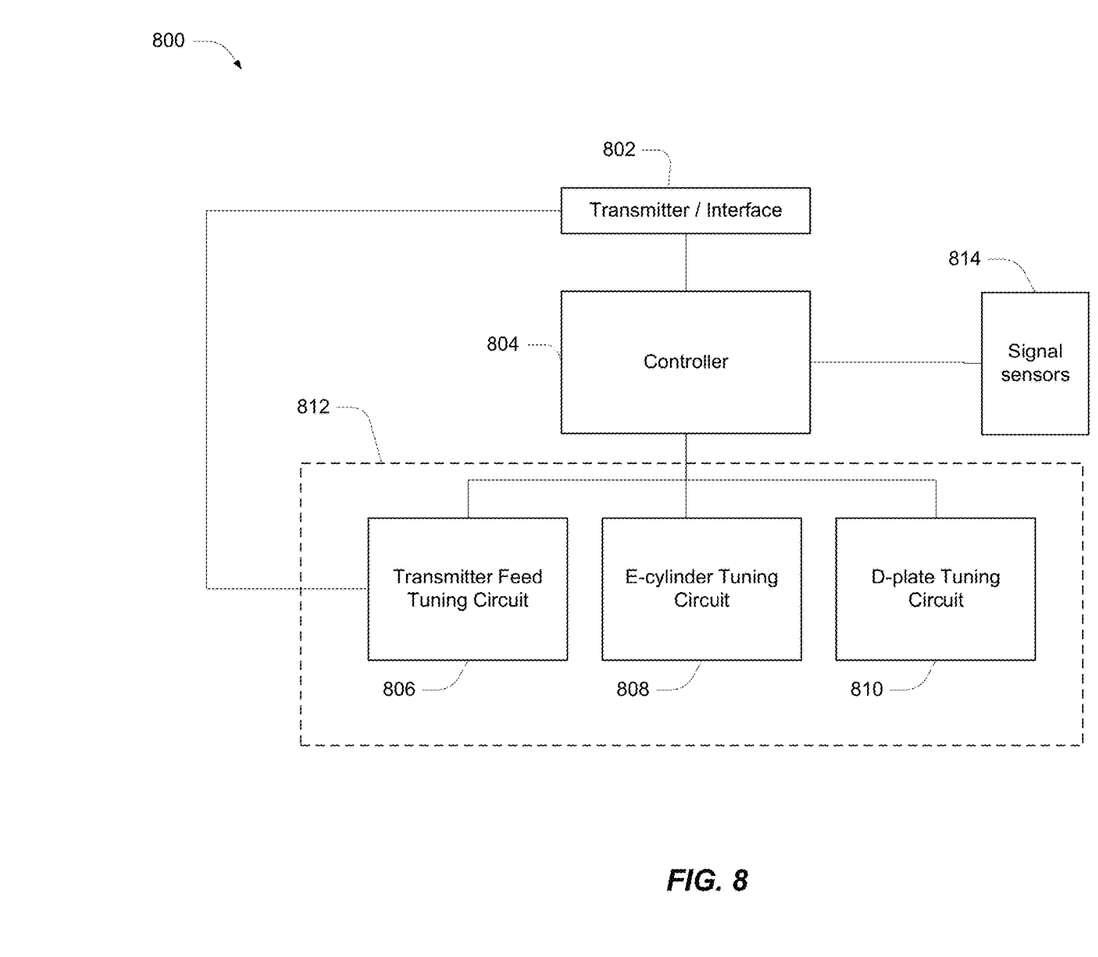
FIG. 8 is a block diagram of a system for tuning an antenna feed network.

Referring to FIG. 8, a block diagram of a system 800 for tuning an antenna feed network is shown. The system 800 includes a transmitter or transmitter interface 802, a controller 804, a tuning network 812, and signal sensors 814. The tuning network 812 includes a transmitter feed tuning circuit 806, an E-cylinder tuning circuit 808, and a D-plate tuning circuit 810. For example, the tuning network 812 may be the network 600 of FIG. 6. The controller 804 may include at least one processor, memory and other computer hardware components configured to exchange control information with the transmitter 802 and the elements within the tuning network 812. In an example, the controller 804 is a computer system. The transmitter 802 provides a signal to the transmitter feed tuning circuit 806, and may be configured to provide transmitter parameters (e.g., power, frequency, SWR, reflected power) to the controller 804, and receive tuning network 812 and other system parameters from the controller 804. The controller 804 may be configured to implement one or more stages of the method 700. In an embodiment, the transmitter feed tuning circuit 806, the E-cylinder tuning circuit 808, and the D-plate tuning circuit 810 may include one or more digital and/or analog actuators configured to vary impedance of the reactive elements in the tuning network 812. For example, the controller 804 may be configured to change the inductance values of L1, L4 and L5 and the capacitance value C3 in the antenna feed network 600. Other circuit elements may also be configured to have controllable reactance values. The controller 804 may also receive signal information from the sampling toroids 602, 604. The signal sensors 814 may include one or more signal sensors such as field strength meters disposed near the HEBA antenna system (e.g., at various distances and bearings) to provide signal feedback information. For example, the signal sensors 814 may be used to measure radiation efficiency at stage 722 of the method 700. The controller 804 may be configured to monitor the performance of a HEBA system and to iterate through one or more stages of the method 700 as required.

Other examples and implementations are within the scope and spirit of the disclosure and appended claims. For example, the method 700 may be automated with auto-tuning algorithms and actuators. The auto-tuning algorithms may persist in a machine-readable medium within a tuning system such as the controller 804. Due to the nature of software and computers, the tuning functions described above can be implemented using software executed by a processor, hardware, firmware, hardwiring, or a combination of any of these. Features implementing functions may also be physically located at various positions, including being distributed such that portions of functions are implemented at different physical locations.

Also, as used herein, "or" as used in a list of items prefaced by "at least one of" or prefaced by "one or more of" indicates a disjunctive list such that, for example, a list of "at least one of A, B, or C," or a list of "one or more of A, B, or C," or "A, B, or C, or a combination thereof" means A or B or C or AB or AC or BC or ABC (i.e., A and B and C), or combinations with more than one feature (e.g., AA, AAB, ABBC, etc.).

As used herein, unless otherwise stated, a statement that a function or operation is "based on" an item or condition means that the function or operation is based on the stated item or condition and may be based on one or more items and/or conditions in addition to the stated item or condition.

Further, an indication that information is sent or transmitted, or a statement of sending or transmitting information, "to" an entity does not require completion of the communication. Such indications or statements include situations where the information is conveyed from a sending entity but does not reach an intended recipient of the information. The intended recipient, even if not actually receiving the information, may still be referred to as a receiving entity, e.g., a receiving execution environment. Further, an entity that is configured to send or transmit information "to" an intended recipient is not required to be configured to complete the delivery of the information to the intended recipient. For example, the entity may provide the information, with an indication of the intended recipient, to another entity that is capable of forwarding the information along with an indication of the intended recipient.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

The terms "machine-readable medium" and "computer-readable medium," as used herein, refer to any medium that participates in providing data that causes a machine to operate in a specific fashion. Using a computer system, various computer-readable media might be involved in providing instructions/code to processor(s) for execution and/or might be used to store and/or carry such instructions/code (e.g., as signals). In many implementations, a computer-readable medium is a physical and/or tangible storage medium. Such a medium may take many forms, including but not limited to, non-volatile media and volatile media. Non-volatile media include, for example, optical and/or magnetic disks. Volatile media include, without limitation, dynamic memory.

Common forms of physical and/or tangible computer-readable media include, for example, a floppy disk, a flexible disk, hard disk, magnetic tape, or any other magnetic medium, a CD-ROM, any other optical medium, punch-cards, papertape, any other physical medium with patterns of holes, a RAM, a PROM, EPROM, a FLASH-EPROM, any other memory chip or cartridge, a carrier wave as described hereinafter, or any other medium from which a computer can read instructions and/or code.

Various forms of computer-readable media may be involved in carrying one or more sequences of one or more instructions to one or more processors for execution. Merely by way of example, the instructions may initially be carried on a magnetic disk and/or optical disc of a remote computer. A remote computer might load the instructions into its dynamic memory and send the instructions as signals over a transmission medium to be received and/or executed by a computer system.

The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations provides a description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, some operations may be performed in parallel or concurrently. In addition, the order of the operations may be rearranged. A process may have additional stages or functions not included in the figure. Furthermore, examples of the methods may be implemented by hardware, software, firmware, middleware, microcode, hardware description languages, or any combination thereof. When implemented in software, firmware, middleware, or microcode, the program code or code segments to perform the tasks may be stored in a non-transitory computer-readable medium such as a storage medium. Processors may perform one or more of the described tasks.

Components, functional or otherwise, shown in the figures and/or discussed herein as being connected or communicating with each other are communicatively coupled. That is, they may be directly or indirectly connected to enable communication between them.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of operations may be undertaken before, during, or after the above elements are considered. Accordingly, the above description does not bound the scope of the claims.

Further, more than one invention may be disclosed.

The invention claimed is:

1. An antenna system, comprising:
a D-plate including a D-plate feed conductor, wherein the D-plate is a horizontal conductor raised above and insulated from a ground plane;
an E-cylinder including an E-cylinder feed conductor, wherein the E-cylinder is a vertical hollow conductive cylinder of smaller diameter than the D-plate, which is mounted concentrically above and insulated from the D-plate;
a transmitter tuning circuit configured to receive a signal from a transmitter;
an E-cylinder tuning circuit operably coupled to the transmitter tuning circuit and the E-cylinder feed conductor; and
a D-plate tuning circuit operably coupled to the transmitter tuning circuit and the D-plate feed conductor;
wherein an E-cylinder tuning circuit reactance and a D-plate tuning circuit reactance are set such that approximately equal power is provided to the E-cylinder and the D-plate, and a transmitter tuning circuit reactance is set based at least in part on the E-cylinder tuning circuit reactance and the D-plate tuning circuit reactance.

2. The antenna system of claim 1 wherein the E-cylinder tuning circuit reactance and the D-plate tuning circuit reactance are set such that a phase difference between an E-cylinder feed signal detected on the E-cylinder feed conductor and a D-plate feed signal detected on the D-plate feed conductor is approximately 90 degrees.

3. The antenna system of claim 1 wherein the transmitter tuning circuit includes a T-network with a first inductor, a second inductor, and a shunt leg including a variable capacitor and a parallel capacitor.

4. The antenna system of claim 3 wherein an inductance value for each of the first inductor and the second inductor is between 1 and 100 microhenries.

5. The antenna system of claim 1 wherein the E-cylinder tuning circuit includes a series inductor and a variable shunt inductor.

6. The antenna system of claim 5 wherein an inductance value for each of the series inductor and the variable shunt inductor is between 1 and 100 microhenries.

7. The antenna system of claim 1 wherein the D-plate tuning circuit 614 includes a series variable inductor with a shunt inductor.

8. The antenna system of claim 7 wherein an inductance value for each of the series variable inductor and the shunt inductor is between 1 and 100 microhenries.

9. A method of tuning a crossed-field antenna including an E-cylinder and D-plate, wherein the E-cylinder and the D-plate are operably coupled to a tuning network including a transmitter feed tuning circuit, an E-cylinder tuning circuit, and a D-plate tuning circuit, the method comprising:
determining a current ratio to provide approximately equal power to the E-cylinder and the D-plate;
setting a reactance of the E-cylinder tuning circuit and a reactance of the D-plate tuning circuit based on the current ratio;
determining a combined impedance value based at least in part on the reactance of the E-cylinder tuning circuit and the reactance of the D-plate tuning circuit; and
setting a reactance of the transmitter feed tuning circuit based on the combined impedance value.

10. The method of claim 9 further comprising determining a phase difference of signals provided to the E-cylinder and the D-plate.

11. The method of claim 10 wherein setting the reactance of the E-cylinder tuning circuit and the reactance of the D-plate tuning circuit is based at least in part on the phase difference.

12. The method of claim 9 further comprising estimating impedance values of each of the E-cylinder and the D-plate, wherein determining the current ratio is based at least in part on the estimated impedance values.

13. The method of claim 12 wherein the estimated impedance values are based at least in part on measurements obtained from a vector network analyzer.

14. A tuning system for coupling a transmitter with a crossed-field antenna, the crossed-field antenna including an E-cylinder and a D-plate, the tuning system comprising:
an E-cylinder tuning circuit operably coupled to the E-cylinder;
a D-plate tuning circuit operably coupled to the D-plate;
a transmitter feed tuning circuit operably coupled to the transmitter, the E-cylinder tuning circuit, and the D-plate tuning circuit; and
a controller operably coupled to the transmitter feed tuning circuit, the E-cylinder tuning circuit, and the D-plate tuning circuit, the controller including at least one processor configured to:
set an E-cylinder tuning circuit reactance and a D-plate tuning circuit reactance such that approximately equal power is provided to the E-cylinder and the D-plate; and
set a transmitter feed tuning circuit reactance based at least in part on the E-cylinder tuning circuit reactance and the D-plate tuning circuit reactance.

15. The tuning system of claim 14 wherein the at least one processor is further configured to set the E-cylinder tuning circuit reactance and the D-plate tuning circuit reactance such that a phase difference between an E-cylinder feed signal and a D-plate feed signal is approximately 90 degrees.

16. The tuning system of claim 14 wherein the transmitter feed tuning circuit includes a T-network with a first inductor, a second inductor, and a shunt leg including a variable capacitor and a parallel capacitor.

17. The tuning system of claim 14 wherein the E-cylinder tuning circuit includes a series inductor and a variable shunt inductor.

18. The tuning system of claim 14 wherein the D-plate tuning circuit 614 includes a series variable inductor with a shunt inductor.

19. The tuning system of claim 14 wherein the controller is operably coupled to the transmitter.

20. The tuning system of claim 14 further comprising one or more signal sensors operably coupled to the controller, wherein the one or more signal sensors are configured to detect signal emitted from the crossed-field antenna.

* * * * *